United States Patent [19]

Dautartas et al.

[11] Patent Number: 5,550,088
[45] Date of Patent: Aug. 27, 1996

[54] FABRICATION PROCESS FOR A SELF-ALIGNED OPTICAL SUBASSEMBLY

[75] Inventors: Mindaugas F. Dautartas, Alburtis, Pa.; Yiu-Huen Wong, Summit, N.J.

[73] Assignee: Lucent Technologies Inc., Murray Hill, N.J.

[21] Appl. No.: 71,427

[22] Filed: Jun. 2, 1993

[51] Int. Cl.⁶ .................................................. H01L 21/302
[52] U.S. Cl. .......................................................... 437/225
[58] Field of Search ............................ 437/225; 156/662

[56] References Cited

U.S. PATENT DOCUMENTS

| | | | |
|---|---|---|---|
| 4,765,865 | 8/1988 | Gealer et al. ........................... | 156/647 |
| 4,810,557 | 3/1989 | Blonder .................................. | 156/662 |
| 4,957,592 | 9/1990 | O'Neill ................................... | 156/662 |
| 5,123,073 | 6/1992 | Pimpinella ............................. | 385/59 |
| 5,131,978 | 7/1992 | O'Neill ................................... | 156/662 |
| 5,257,332 | 10/1993 | Pimpinella ............................ | 385/59 |

*Primary Examiner*—Robert Kunemund
*Assistant Examiner*—Linda J. Fleck
*Attorney, Agent, or Firm*—Wendy W. Koba

[57] ABSTRACT

A method is disclosed for forming a self-aligned optical subassembly for supporting an optical fiber and associated optical component(s). In particular, sequential masking layer/silicon substrate etch operations are performed so as to etch, in series, the largest opening first and the narrowest opening last. By following this procedure, axial alignment between tandem grooves is maintained.

7 Claims, 4 Drawing Sheets

FABRICATION PROCESS FOR A SELF-ALIGNED OPTICAL SUBASSEMBLY

BACKGROUND OF THE INVENTION

1. Technical Field

The present invention relates to a self-aligned optical subassembly and, more particularly, to a method of processing a silicon substrate to form a self-aligned optical subassembly.

2. Description of the Prior Art

An important factor in the design and implementation of optical communication systems is the cost and complexity of the packaging for the optical subsystem (i.e., the active optical device, coupled optical fiber and, perhaps, associated electronics). In recent years, advances in packaging have progressed from machined metal piece parts to combinations of metal components and silicon-based components. Advantageously, silicon processing is well-known, relatively inexpensive, and provides for the ability to form a package structure including optically aligned features.

An exemplary utilization of silicon in the formation of a subassembly for optoelectronic devices is disclosed in U.S. Pat. No. 4,945,400 (Blonder et at.) issued Jul. 31, 1990 and assigned to the assignee of record in this application. In general, Blonder et al. disclose a subassembly including a semiconductor (e.g., silicon) base and lid including a variety of etched features (e.g., grooves, cavities, alignment detents) and metallization patterns (e.g., contacts, reflectors) which enable the optoelectronic device to be reliably and inexpensively mounted on the base and coupled to a communicating optical fiber. In particular, Blonder et al. disclose an arrangement wherein the optoelectronic device (e.g., LED) is disposed within a cavity formed by a lid member and the communicating fiber is positioned along a groove formed in a base member. A reflective metallization is utilized to optically couple the device to the fiber. Therefore, positioning of the device over the reflector is the only active alignment step required to provide coupling. Any remaining alignments are accomplished utilizing fiducial features formed in the base and lid members.

Although the Blonder et al. subassembly represents a significant advance in the filed of silicon optical bench packaging, a need remains for providing an arrangement which requires no active alignments to be performed. The provision of a completely passive optical packaging ,arrangement being considered both more reliable and less expensive than virtually any alternative requiring active alignment between components.

SUMMARY OF THE INVENTION

The present invention relates to further advances in the field of silicon optical bench technology and, more particularly, to a method of fabricating a self-aligned optical subassembly for capturing an end section of an optical fiber (referred to as a "fiber stub") and providing alignment of the optical fiber to an associated optical component (either an active or a passive component).

In accordance with an exemplary fabrication process of the present invention, a silicon substrate is patterned with a masking layer (for example, silicon dioxide) such that the thickness of the masking layer disposed over locations to include etched openings is inversely related to the desired final depth of each opening. That is, the masking layer will be patterned such that the area to include the deepest opening will have the thinnest masking layer and the area to include the most shallow opening will have the thickest masking layer covering. A series of masking layer/silicon substrate etch processes are then performed to sequentially etch the various predetermined areas.

For one exemplary process of the present invention, a series of three tandem openings are to be formed, a first opening to capture an optical component and a pair of tandem grooves (in axial alignment with the first opening) to support an optical fiber, where the first groove of the tandem pair (located adjacent to the first opening) is relatively shallow and used to support a bare optical fiber end section. The second groove of the tandem pair is thus relatively deeper and used to support the coated following section of fiber beyond the bare end section.

In an alternative fabrication process, the mask pattern(s) may be modified to allow for the formation of alignment fiducials in the form of pyramidal detents during the tandem opening etch process. Additional modifications to the patterns (in the form of necked-down areas, for example) may be used to control the length of the etched openings.

An advantage of the technique of the present invention is that the sequential masking layer/silicon substrate etch process results in the ability to maintain axial alignment along the series of tandem openings. In contrast, the use of a conventional single etch step to form all openings would result, for example, in the widening of the groove for supporting the bare fiber and, most likely, the loss of optical alignment between the bare fiber and the associated optical component.

An additional advantage of the technique of the present invention is that all photolithography operations are completed before the etching processes are begun, thus eliminating the need for any deep level photolithography processes.

Other and further advantages of the present invention will become apparent during the course of the following discussion and by reference to the accompanying drawings.

BRIEF DESCRIPTION OF THE DRAWING

Referring now to the drawings, where like numerals represent like parts in several views, FIG. 1 contains an isometric view of an exemplary fiber stub subassembly formed using the process of the present invention.

DETAILED DESCRIPTION

Figure 1:
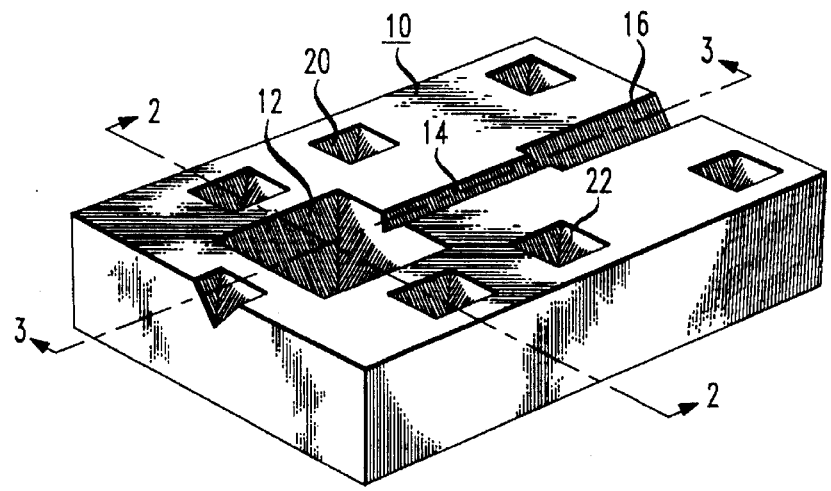
Figure 2:
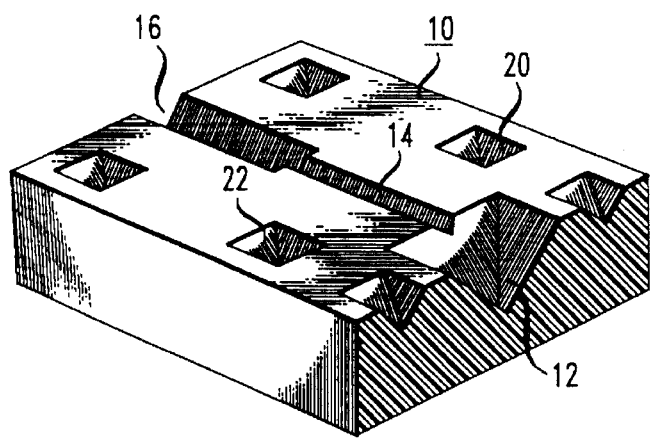
FIG. 2 contains an isometric view of a finished exemplary fiber stub subassembly of the present invention, where the subassembly of FIG. 1 is cut along illustrated line 2—2 to form the finished subassembly of FIG. 2.

An exemplary silicon substrate 10 containing a number of etched openings formed in accordance with the present invention is illustrated in FIG. 1. As shown, a large pyramidal opening 12 is used to allow for the capture of an optical component (e..g, LED, PIN photodetector or spherical lens). A first, relatively narrow groove 14, formed to the right of opening 12, is used to support a stripped end section of an optical fiber. Lastly, a second groove 16 is formed in tandem with first groove 14 and is used to support a coated fiber. In order to complete the fabrication of the fiber stub assembly, substrate 10 of FIG. 1 must be cut along line 2—2 to form the piece part as illustrated in FIG. 2. The fiber stub subassembly of FIG. 2 may then be mated with another substrate which supports (in an aligned configuration) the optical component to be coupled to the optical fiber. A complete description of such an arrangement may be found in U.S. Pat. No. 5,179,609, issued on Jan. 12, 1993 and assigned to the assignee of the present application. Advantageously, a number of alignment fiducials, such as fiducials 20 and 22 shown in FIGS. 1 and 2, may also be formed on substrate 10 and then used to provide both alignment and mechanical attachment of the fiber stub subassembly to a cover plate substrate (not shown).

Figure 3:
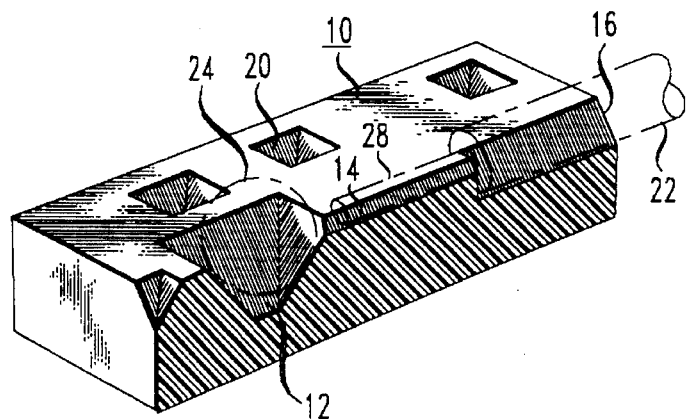
FIG. 3 is a side view of the subassembly as shown in FIG. 1, taken along line 3—3 of FIG. 1.

As mentioned above, an important aspect of optical packaging is the ability to provide passive alignment between components, in this case, between the optical fiber and an associated optical component. Such alignment is indicated in FIG. 1, by reference to line 3—3. FIG. 3 contains a side view of the substrate, taken along the optical axis line 3—3, and indicates the placement of both an optical component 24 within opening 12 and the support of an optical fiber 26, including a bare end section 28, as supported by tandem grooves 14 and 16. As will be discussed in detail below, the silicon processing steps of the present invention allow for passive alignment between component 24 and fiber end section 28 to be achieved. FIGS. 5–9 illustrate a set of exemplary steps used to pattern a masking layer so as to form different thicknesses of masking material in the previously-determined etch locations. FIGS. 10–14 then illustrate the series of sequential etch operations used to form a complete optical subassembly.

Figure 4:
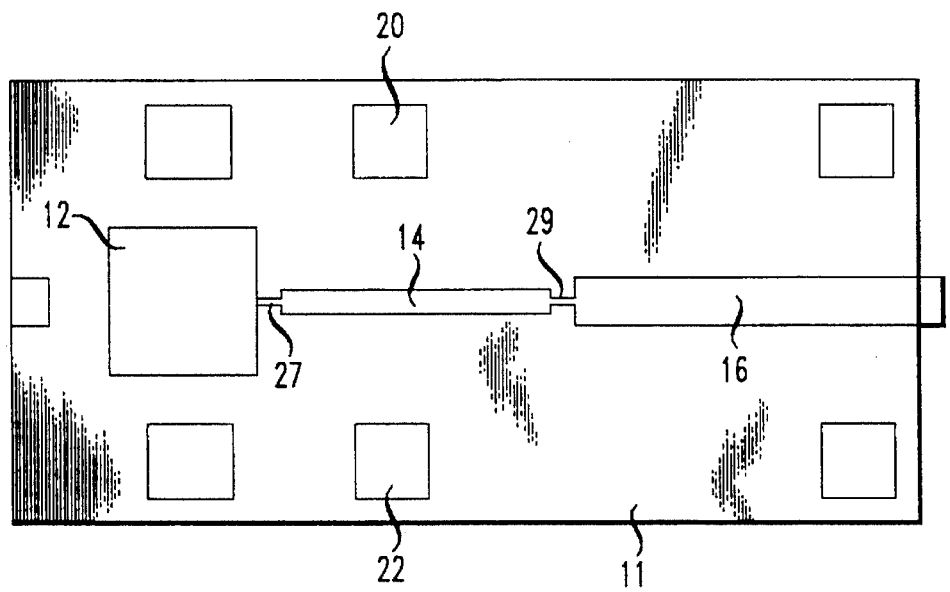
FIG. 4 is a top view of an exemplary mask pattern which may be used to form the fiber stub subassembly of the above views.

FIG. 4 contains a top view of an exemplary mask pattern useful in forming the fiber stub subassembly described above. As shown, the pattern includes a relatively large feature associated with large opening 12 (for placement of the optical device), and a pair of tandem openings 14 and 16 disposed adjacent to opening 12. Evident in this view are necked-down regions 27 and 29 which are advantageously used to control the etching of both opening 12 and groove 16 with respect to groove 14. Without these necked-down regions, the etching operation used to form opening 12 may encroach upon the left hand side of groove 14, reducing its overall length. The same effect may result in over-etching groove 16 with respect to the right hand side of groove 14. Regions 27 and 29, therefore, will virtually eliminate this over-etching and result in forming groove 14 with the necessary length.

Figure 5:
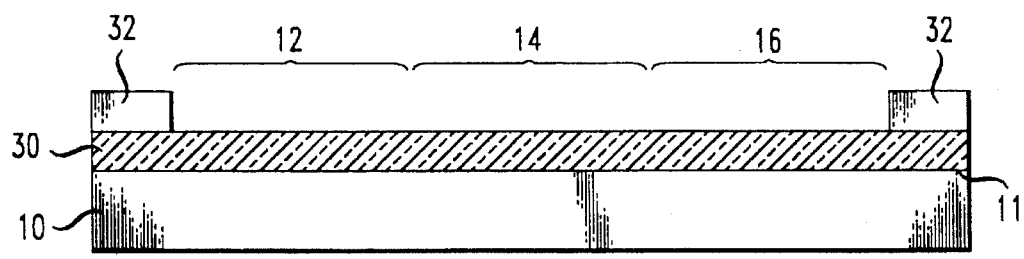
FIGS. 5–9 illustrate a series of photolithography steps used to pattern a masking layer so as to form different thicknesses of masking material with respect to the different openings as shown on the mask pattern of FIG. 4.
Figure 6:
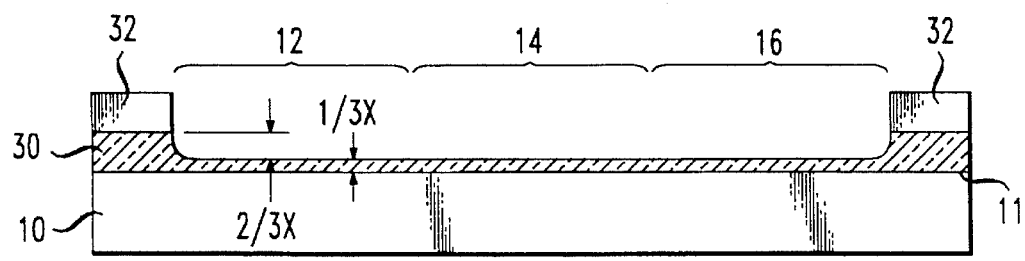

FIG. 5 illustrates an exemplary silicon substrate 10 at the initial stage of the fabrication process. In particular, top surface 11 of substrate 12 is covered with a masking layer 30, where layer 30 may comprise any well-known masking material, including silicon dioxide. Layer 30 should be relatively thick, for example 2 µm, but its exact thickness is not of great concern. As will be discussed in detail below, layer 30 is patterned to result in comprising a different thickness in areas which are designated to be etched to different depths. The difference in masking layer thickness, in accordance with the teachings of the present invention, may then be used to control the sequential etching operations used to form the tandem openings while maintaining optical alignment. Referring back to FIG. 5, masking layer 30 is subsequently covered by a photoresist layer 32 which is patterned so as to provide for the removal of photoresist in the area where openings 12,14 and 16 will be formed. The structure as shown in FIG. 5 is subsequently etched (using any suitable etching technique, such as plasma-assisted or wet chemical) until approximately two-thirds of masking layer 30 (in the exposed area to form openings 12,14 and 16) is removed. The etch thus results in forming the structure as illustrated in FIG. 6.

Figure 7:
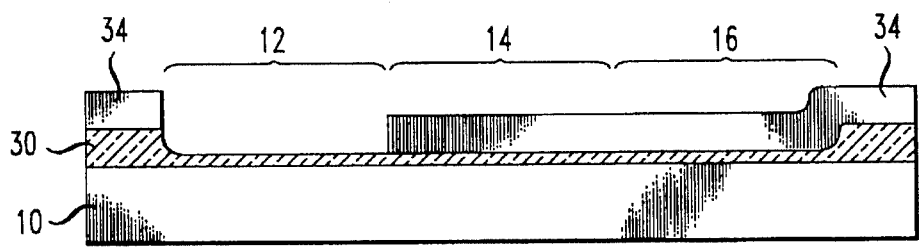
Figure 8:
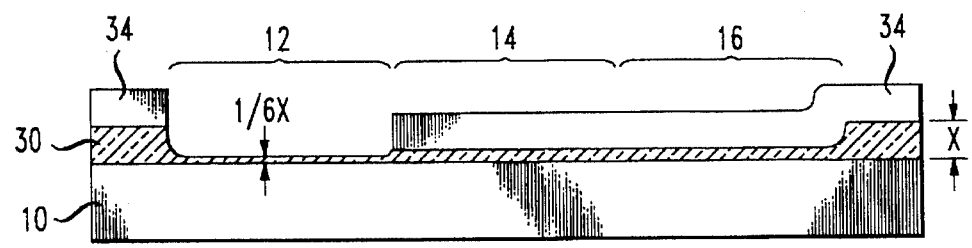

Referring now to FIG. 7, photoresist layer 32 is removed and a new photoresist layer 34 is deposited and patterned so as to expose only the area where opening 12 (the largest of the openings) is to be formed. The portion of masking layer 30 exposed as shown in subsequently etched (as before, any suitable etch may be used, for example, plasma-assisted or wet chemical) so as to remove approximately half of the masking material and thus form the structure as illustrated in FIG. 8. Subsequent to this etch step, photoresist layer 34 is removed and a new photoresist layer 36 is deposited and patterned as shown in FIG. 9 so as to expose the areas where openings 12 and 16 will be formed (the larger two openings when compared with opening 14).

Figure 9:
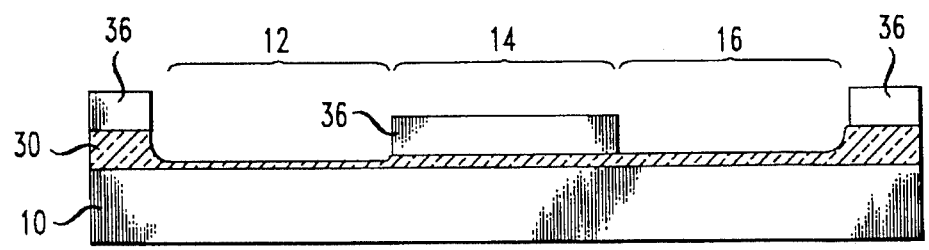
Figure 10:
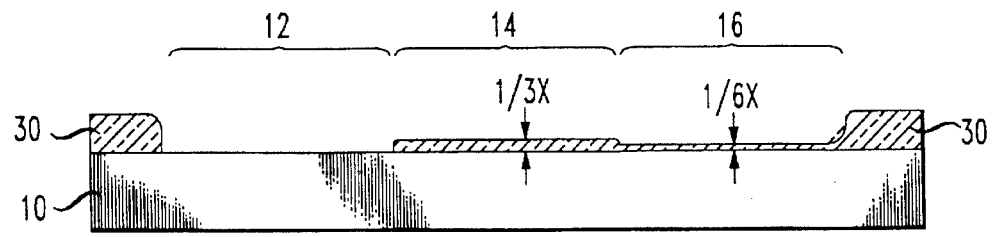
FIG. 10–14 illustrate the series of sequential etch operations useful in the method of forming a self-aligned fiber stub subassembly in accordance with the teachings of the present invention.

The structure as illustrated in FIG. 9 is then etched until surface 11 of substrate 10 is exposed in the area of opening 12. That is, the remaining portion of masking layer 30 associated with opening 12 is completely removed. The removal of the portion of masking layer 30 associated with opening 12 thus results in forming a reduced thickness of masking material 30 associated with the area of opening 16. The structure at this point in the process is illustrated in FIG. 10.

In accordance with the teachings of the present invention, a series of mask/silicon etch operations may now be performed to sequentially provide openings in the silicon of the desired thicknesses. That is, the thickness of masking layer 30 is now related (inversely) to the desired final depth of each opening. In particular, the masking layer comprises the greatest thickness ($t_2$) over the area associated with first groove 14, followed by a thickness of $t_1 < t_2$) over the area associated with second groove 16, where the masking material has been completely removed from the area associated with the deepest opening 12. Advantageously, the above-described process of tailoring the thickness of the masking layer with respect to the desired final depths of the features (i.e., opening 12 and grooves 14,16) eliminates the need to perform any further photolithography operations in the formation of the final fiber stub subassembly.

Figure 11:
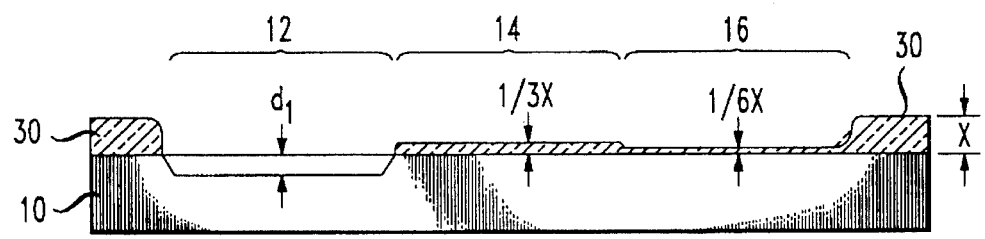

Referring to FIG. 11, a first silicon etch may now be performed to provide for opening 12 to comprise a predetermined depth of $d_1$, where the predetermined may be controlled by the material used to etch, as well as the time and temperature conditions. For example, the etch may be performed using ethylenediamine pyrochatecol (EDP) at a temperature of 115° C. in a nitrogen atmosphere, where it is known that this particular material will etch silicon at a rate of 25 µm/hour. The structure at the end of this first silicon etch step is illustrated in FIG. 11.

Figure 12:
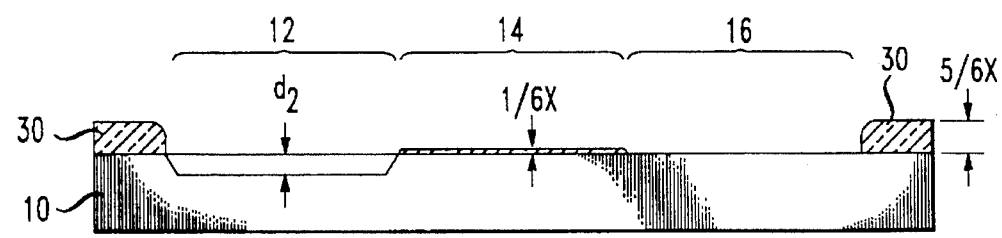
Figure 13:
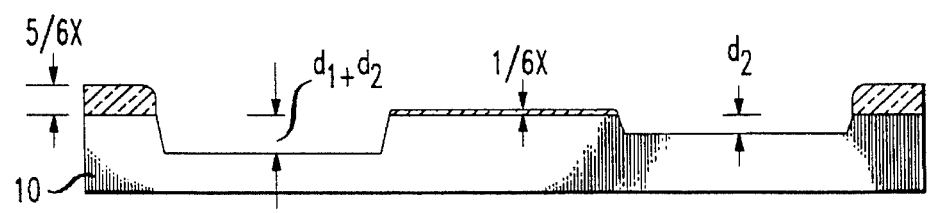

Subsequent to this first EDP etch, a masking layer etch operation (using, for example a plasma or buffered oxide) is performed to blanket remove a predetermined thickness of masking layer 30 sufficient to expose surface 11 of substrate 10 in the area of opening 16, as shown in FIG. 12. This etch thus also reduces the thickness of masking layer 30 covering area 14. A second EDP etch is then performed so as to provide an opening 16 with a predetermined depth of $d_2$. The second EDP etch will also further etch first opening 12, resulting in opening 12 having a depth of $d_1+d_2$. FIG. 13 illustrates the structure at this point in the process.

Figure 14:
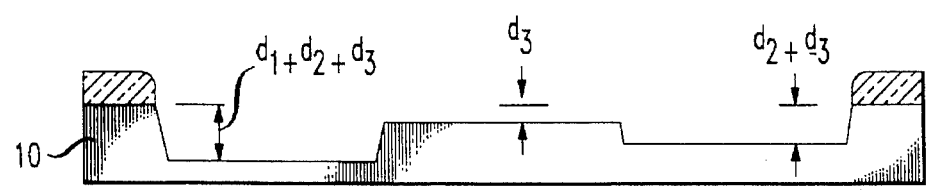

After the second EDP etch is completed, a final masking material etch is performed to remove an amount of masking layer 30 sufficient to expose surface 11 of substrate 10 in the area of opening 14. A third EDP etch is then performed so as to form opening 14 to comprise a third predetermined depth $d_3$, as shown in FIG. 14. Further referring to FIG. 14, which illustrates the final structure of the fiber stub subassembly, opening 16 will comprise a final depth of $d_2+d_3$, and opening 12 will comprise a final depth of $d_1+d_2+d_3$. Therefore, by knowing the desired final depths for all three openings, the intermediate depths required for the first EDP etch (to form a depth $d_1$) and the second EDP etch (to form a depth $d_2$) may be determined.

Various other etched openings, for example, fiducials 20 and 22, may be formed during any desired EDP etch step as described above (or during subsequent etch operations), where the specific EDP step used (e.g., either first, second, third, or subsequent) will determine the final depth of the openings. In particular, if the masking layer is patterned and the process refined to include a fourth EDP etch, associated with the formation of fiducials, the fiducials will be formed to comprise a shallower depth than any of the previously-formed features.

It is to be understood that the process as described above is exemplary only, and there exist many modifications, apparent to those skilled in the art, which are considered to fall within the spirit and scope of the present invention. For example, materials other than silicon dioxide may be used to form the masking layer (which in turn can serve as intermetal dielectrics for multi-level metallization schemes for interconnections) and procedures other than the above-described EDP etch may be used to sequentially form the optically aligned openings, as described fully above.

We claim:

1. A method of forming a fiber-supporting substrate to provide for passive optical alignment between an optical fiber and at least one associated optical component(s), the method comprising the steps of:

a) providing a silicon substrate including a top major surface;

b) forming a masking layer on said silicon substrate top major surface;

c) patterning said masking layer such that different areas of said masking layer comprise different thicknesses, said areas associated with the location of said optical fiber and said associated optical component(s), wherein the patterning is performed to provide passive optical alignment between said optical fiber and said associated optical components(s);

d) etching said masking layer until an underlying surface of said silicon substrate is first exposed;

e) etching said exposed silicon substrate to a predetermined depth; and f) repeating steps d) and e) until all openings required to support said optical fiber and said aligned associated optical component(s) have been formed.

2. A method of forming a fiber-supporting substrate to provide for passive alignment between an optical fiber, including a bare end section and a coated following section, and an associated optical component, the method comprising the steps of:

a) providing a silicon substrate including a top major surface;

b) forming a masking layer on said silicon substrate top major surface;

c) exposing said masking layer to delineate aligned locations for said optical fiber and said associated aligned optical component;

d) etching said exposed masking layer so as to remove essentially all masking material in the region where said assoicated aligned optical component will be located, said etching step thus resulting in said masking layer having a first thickness $t_1$ in the area where said coated following section of said fiber will be located and a second thickness $t_2$ in the area where said bare end section of said fiber will be located, wherein the areas are formed to be in axial optical alignment;

e) etching said exposed silicon to a first depth $d_1$;

f) etching said masking layer for a period of time sufficient to expose the silicon surface in the area associated with said coated fiber section;

g) etching said exposed silicon for a period of time sufficient to form an opening with a predetermined second depth $d_2$ in the area where said coated fiber will be supported;

h) etching said masking layer for a period of time sufficient to expose the silicon surface in the area associated with the bare fiber end section; and i) etching said expensed silicon for a period of time sufficient to form an opening with a predetermined third depth $d_3$ in the area where said bare fiber end section will be supported.

3. The method according to either claim 1 or 2 wherein in performing step b), a silicon dioxide layer is used as the masking layer.

4. The method according to claim 3 wherein the silicon dioxide layer is a grown, thermal oxide.

5. The method according to claim 3 wherein in performing the steps associated with etching the masking layer, a plasma etch operation is used.

6. The method according to claims 1 or 2 wherein in performing the steps associated with the etching of silicon, ethyenediamine pyrocutechol (EDP) is used to perform the etching.

7. The method according to claim 6 wherein in performing the etching with EDP, the etch is performed at a temperature of approximately 115° C. in a nitrogen atmosphere.

* * * * *